(12) United States Patent
Mun et al.

(10) Patent No.: US 11,013,155 B2
(45) Date of Patent: May 18, 2021

(54) ELECTROMAGNETIC WAVE SHIELDING STRUCTURE AND MANUFACTURING METHOD THEREFOR

(71) Applicant: Samsung Electronics Co., Ltd., Suwon-si (KR)

(72) Inventors: Ilju Mun, Suwon-si (KR); Hosuk Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/966,446

(22) PCT Filed: Jan. 30, 2019

(86) PCT No.: PCT/KR2019/001285
§ 371 (c)(1),
(2) Date: Jul. 30, 2020

(87) PCT Pub. No.: WO2019/151768
PCT Pub. Date: Aug. 8, 2019

(65) Prior Publication Data
US 2020/0367393 A1 Nov. 19, 2020

(30) Foreign Application Priority Data

Jan. 30, 2018 (KR) .................. 10-2018-0011452

(51) Int. Cl.
*H05K 9/00* (2006.01)
*H01L 23/498* (2006.01)
*H01L 23/552* (2006.01)

(52) U.S. Cl.
CPC ..... *H05K 9/0022* (2013.01); *H01L 23/49838* (2013.01); *H01L 23/552* (2013.01); *H05K 9/0039* (2013.01)

(58) Field of Classification Search
CPC .................. H05K 9/0022–0039; H01L 23/552
See application file for complete search history.

(56) References Cited

U.S. PATENT DOCUMENTS 4,831,498 A * 5/1989 Baba ................... H05K 9/0033
174/356
8,279,625 B2 10/2012 Just et al.
(Continued)

FOREIGN PATENT DOCUMENTS

JP 2015-065343 A 4/2015
KR 10-2013-0036036 A 4/2013
(Continued)

OTHER PUBLICATIONS

International Search Report dated May 16, 2019 in connection with International Patent Application No. PCT/KR2019/001285, 2 pages.
(Continued)

*Primary Examiner* — Hoa C Nguyen

(57) ABSTRACT

Disclosed is an electromagnetic wave shielding structure. The electromagnetic wave shielding structure comprises: a printed circuit board having a plurality of elements mounted therein and having a ground pad surrounding the plurality of elements; an insulation member made of a pre-molded insulating material and attached to the printed circuit board to surround the plurality of elements; and a conductive coating layer covering an exterior surface of the insulation member, wherein the conductive coating layer is connected to the ground pad.

14 Claims, 16 Drawing Sheets

(56) References Cited

U.S. PATENT DOCUMENTS

| | | | |
|---|---|---|---|
| 8,987,872 B2 | 3/2015 | Hwang et al. | |
| 9,179,538 B2 | 11/2015 | Foster et al. | |
| 9,589,905 B2 | 3/2017 | Choi et al. | |
| 9,666,538 B1* | 5/2017 | Bolognia | H01L 23/26 |
| 10,201,072 B2 | 2/2019 | Kuk et al. | |
| 10,624,248 B2 | 4/2020 | Kim et al. | |
| 2006/0220238 A1* | 10/2006 | Kim | H05K 9/0026 |
| | | | 257/731 |
| 2009/0260872 A1 | 10/2009 | Chen | |
| 2012/0104571 A1* | 5/2012 | Yoo | H01L 24/97 |
| | | | 257/659 |
| 2016/0270213 A1* | 9/2016 | Salehi | H05K 3/284 |
| 2018/0116078 A1* | 4/2018 | Mun | H05K 9/0039 |

FOREIGN PATENT DOCUMENTS

| | | |
|---|---|---|
| KR | 10-2014-0023381 A | 2/2014 |
| KR | 10-2014-0083084 A | 7/2014 |
| KR | 10-2015-0055987 A | 5/2015 |
| KR | 10-2016-0044953 A | 4/2016 |
| KR | 10-2018-0000668 A | 1/2018 |
| KR | 10-2018-0067047 A | 6/2018 |

OTHER PUBLICATIONS

Written Opinion of the International Searching Authority dated May 16, 2019 in connection with International Patent Application No. PCT/KR2019/001285, 4 pages.

\* cited by examiner

ELECTROMAGNETIC WAVE SHIELDING STRUCTURE AND MANUFACTURING METHOD THEREFOR

CROSS-REFERENCE TO RELATED APPLICATIONS

This application is a 371 of International Application No. PCT/KR2019/001285 filed on Jan. 30, 2019, which claims priority to Korean Patent Application No. 10-2018-0011452 filed on Jan. 30, 2018, the disclosures of which are herein incorporated by reference in their entirety.

BACKGROUND

1. Field

The disclosure relates to an electromagnetic wave shielding structure and a manufacturing method therefor, and more particularly to an electromagnetic wave shielding structure capable of shielding electromagnetic waves while protecting a semiconductor chip or an element included in a package from an external environment, and a manufacturing method therefor.

2. Description of Related Art

Recently, demands for portable electronic devices such as smartphones are rapidly increasing in the market of electronic products, and accordingly, size reduction and weight reduction of electronic components to be mounted on such products are required. In order to realize the size reduction and the weight reduction of electronic components, a semiconductor packaging technology of integrating a plurality of individual elements into one package is required, in addition to a technology of reducing a size of individual mounted component. Particularly, it is necessary for a semiconductor package using a high frequency signal to have various electromagnetic wave shielding structures, in order to realize electromagnetic wave interference or electromagnetic susceptibility, in addition to the size reduction.

A structure covering various elements mounted on a printed circuit board with a pressed metal shield can has been proposed.

Such an electromagnetic wave shielding structure of the related art had a limit in application of a shield can having a predetermined thickness or thicker in accordance with an increase in integration rate of elements due to the technology development, and the electromagnetic wave shielding structure using the shield can of the related art had a problem such as reduction of high integration rate of the elements.

In addition, when performing rework of taking a soldered element off from a printed circuit board to replace the element with a normal element due to a problem with the element mounted on the printed circuit board, a shield can soldered on the printed circuit board has to be removed. But, the shield can is also soldered on the printed circuit board and accordingly, solder of elements mounted on the printed circuit board was melted in a process of melting the solder of the shield can by heating, and this caused separation of the elements from the printed circuit board or deviation thereof from a predetermined position.

In addition, the metal shield can of the related art has a limit in application of various shapes such as a step of a surface, curvature, three-dimensional shapes and the like in the manufacturing step.

SUMMARY

An object of the disclosure is to provide an electromagnetic wave shielding structure capable of covering a shielding area of various shapes and a manufacturing method therefor.

According to an aspect of the disclosure to achieve the abovementioned object, there is provided an electromagnetic wave shielding structure including a printed circuit board on which a plurality of elements are mounted and which includes a ground pad surrounding the plurality of elements, an insulation member made of a pre-molded insulating material and attached to the printed circuit board to surround the plurality of elements, and a conductive coating layer configured to cover an exterior surface of the insulation member, in which the conductive coating layer is connected to the ground pad.

The electromagnetic wave shielding structure may further include an adhesive portion configured to be disposed between the insulation member and the printed circuit board and attach the insulation member to the printed circuit board.

The ground pad may be formed on one surface of the printed circuit board in a shape surrounding the insulation member, and the conductive coating layer may cover at least a part of the ground pad.

The adhesive portion may be formed on an inner portion of the ground pad along a circumference of the ground pad on one surface of the printed circuit board.

The insulation member may include a plurality of accommodation grooves formed on one side facing the printed circuit board and accommodating the plurality of elements.

The plurality of accommodation grooves may be formed in a shape corresponding to shapes of the plurality of elements.

The insulation member may include an upper surface portion disposed on an upper side of the plurality of elements, and a side wall portion disposed along a circumference of the upper surface portion and surrounding the plurality of elements, the plurality of accommodation grooves may be formed on an inner portion of the side wall portion, and the adhesive portion may be disposed between the side wall portion and the printed circuit board.

The insulation member may include at least one protrusion disposed on an inner portion of the side wall portion and protruding from the upper surface portion towards the printed circuit board to partition the plurality of accommodation grooves.

At least a part of the at least one protrusion may be spaced apart from the printed circuit board so that the plurality of accommodation grooves communicate with each other.

The side wall portion may include a vent hole penetrating the side wall portion to communicate with at least one of the plurality of accommodation grooves.

The vent hole may be formed on a lower end of the side wall portion.

At least a part of the upper surface portion may form a step.

The plurality of accommodation grooves may have heights set to be higher than heights of the plurality of elements, respectively, and include a plurality of air gaps formed between the upper surface portion and the plurality of elements.

Heights of the plurality of air gaps may be set to be different from each other.

The side wall portion may include a recess formed on a lower edge of the side wall portion, and a part of the adhesive portion may be accommodated in the recess.

According to the disclosure for achieving the object, there is provided a method for manufacturing an electromagnetic wave shielding structure, the method including discharging an adhesive material to an inner portion of a ground pad on a printed circuit board along a circumference of the ground pad surrounding a plurality of elements mounted on the printed circuit board, attaching an insulation member made of a pre-molded insulating material to the adhesive material to surround the plurality of elements, and coating a conductive material to cover an exterior surface of the insulation member and at least a part of the ground pad.

According to the disclosure for achieving the object, there is provided a method for manufacturing an electromagnetic wave shielding structure, the method including discharging an adhesive material to an inner portion of a ground pad on a printed circuit board along a circumference of the ground pad surrounding a plurality of elements mounted on the printed circuit board, attaching an insulation member made of a pre-molded insulating material having an exterior surface combined with a conductive coating portion to the adhesive material to surround the plurality of elements, and electrically connecting the conductive coating portion to the ground pad by applying a conductive material to a boundary between the insulation member and the printed circuit board.

DETAILED DESCRIPTION

In order to fully understand configurations and effects of the disclosure, preferred embodiments of the disclosure will be described with reference to the accompanying drawings. However, the disclosure is not limited to the embodiments below and may be implemented in various forms and variously changed. The description regarding the embodiments is provided to complete the disclosure and let those skilled in the art completely know the scope of the disclosure. Elements in the accompanying drawings are shown enlarged from their actual sizes for convenience of description and a proportion of each element may be magnified or reduced.

It should be understood that, when it is described that a certain element is "on" or "in contact with" another element, the certain element may be directly on or connected to another element, but still another element may be present between those. In contrast, it should be understood that, when it is described that a certain element is "directly on" or "directly in contact with" another element, still another element may not be present. The same interpretation may apply to expressions describing the relationship between elements, for example, "between" or "directly between".

The expressions "first," "second" and the like may be used for describing various elements, but the elements may not be limited by the expressions. The expressions may be used only to distinguish one element from another. For example, a first element may be referred to as a second element and the second element may also be similarly referred to as the first element, while not departing from the scope of a right of the disclosure.

Unless otherwise defined specifically, a singular expression may encompass a plural expression. It is to be understood that the terms such as "comprise" or "consist of" are to designate a presence of characteristic, number, step, operation, element, part, or a combination thereof, and may be interpreted as that one or more of other characteristics, numbers, steps, operations, elements, parts or a combination thereof may be added.

The terms used in the embodiments of the disclosure may be interpreted as meanings known to those skilled in the art, unless otherwise defined.

An electromagnetic wave shielding structure according to an embodiment of the disclosure may be applied to various electronic devices such as a smartphone, a display device, a wearable device, and the like. In addition, the electromagnetic wave shielding structure according to an embodiment of the disclosure may be configured to shield various types of a plurality of elements or a single element.

Hereinafter, the electromagnetic wave shielding structure according to an embodiment of the disclosure will be described in detail with reference to the drawings.

Figure 1:
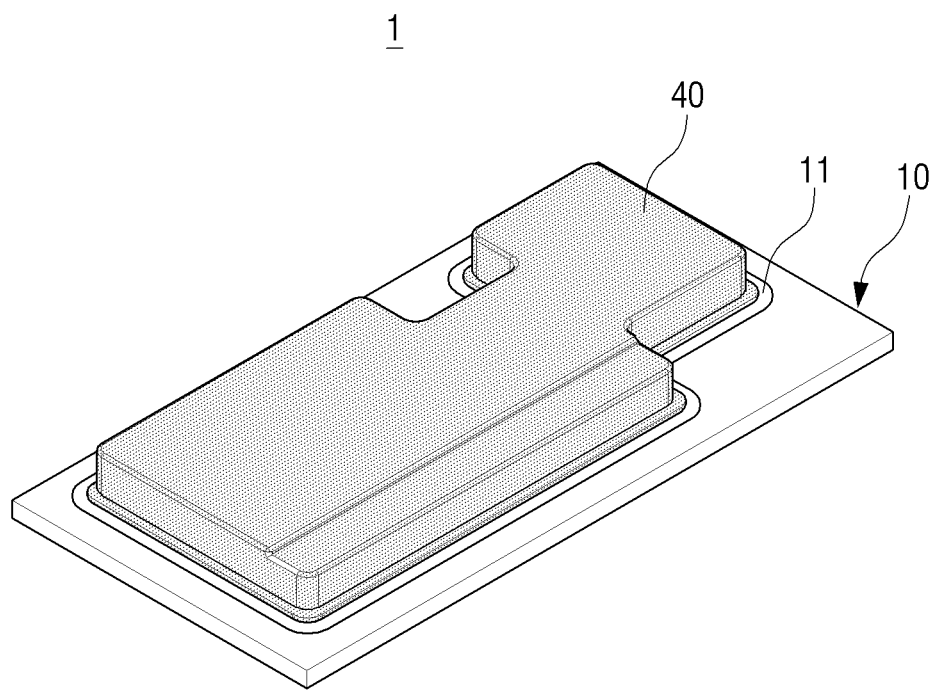
FIG. 1 is a perspective view of an electromagnetic wave shielding structure according to an embodiment.
Figure 2:
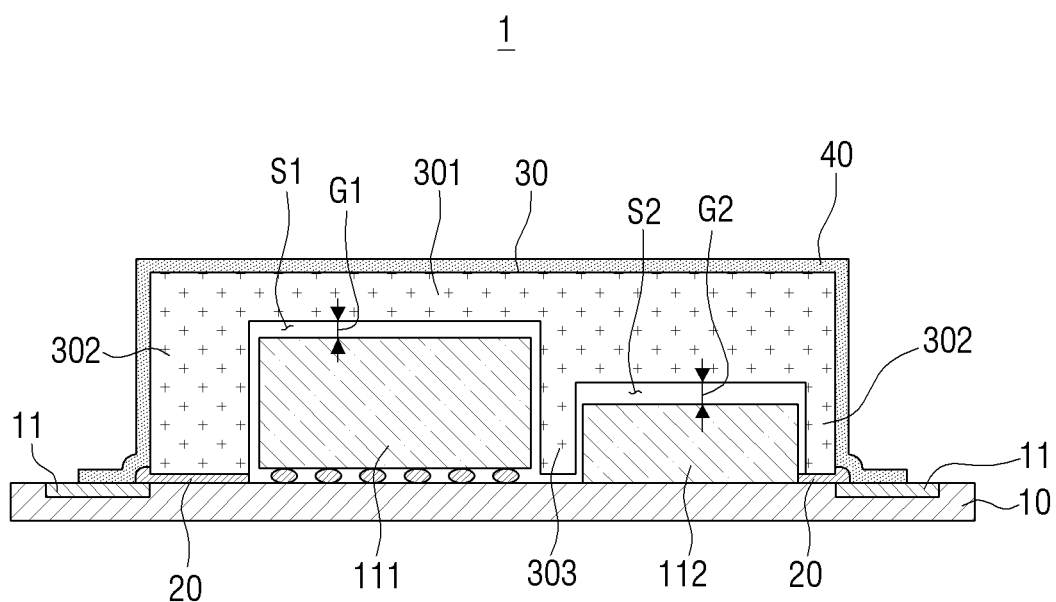
FIG. 2 is a cross-sectional view schematically illustrating a cross section of the electromagnetic wave shielding structure illustrated in FIG. 1.
Figure 3:
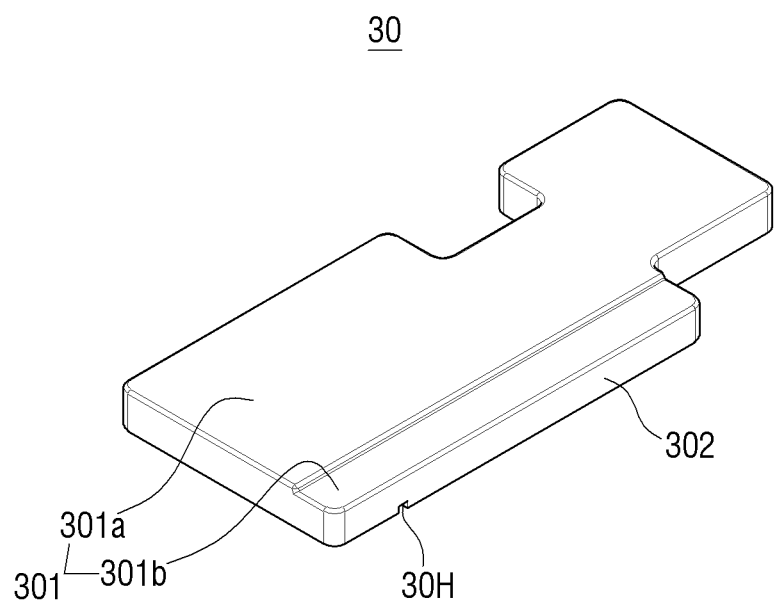
FIG. 3 is a perspective view of an insulation member according to an embodiment.

FIG. 1 is a perspective view of an electromagnetic wave shielding structure 1 according to an embodiment of the disclosure, FIG. 2 is a cross-sectional view schematically illustrating a cross section of the electromagnetic wave shielding structure 1 illustrated in FIG. 1, and FIG. 3 is a perspective view of an insulation member 30 according to an embodiment of the disclosure.

The electromagnetic wave shielding structure 1 according to an embodiment of the disclosure may include a printed circuit board 10 on which a plurality of elements 111 and 112 are mounted, the insulation member 30 made of a pre-molded insulating material and attached to the printed circuit board 10 to surround the plurality of elements 111 and 112, and a conductive coating layer 40 covering an exterior surface of the insulation member 30.

Referring to FIG. 2, the electromagnetic wave shielding structure 1 may include the printed circuit board 10 and the plurality of elements 111 and 112 mounted on the printed circuit board 10. The plurality of elements 111 and 112 may be different types of circuit elements and may be integrated circuit chips (IC chips), passive elements, and release components. For example, the IC chip may be an application processor (AP), a memory, a radio frequency (RF) chip, or the like, the passive element may be a resistor, a condenser, a coil, or the like, and the release component may be a connector, a card socket, or an electromagnetic wave shielding component.

At least one of elements 111 and 112 may be mounted on one surface of the printed circuit board 10, and the plurality of elements 111 and 112 may be mounted on an upper surface of the printed circuit board 10, as illustrated in FIG. 2.

FIG. 2 illustrates that the two elements 111 and 112 are mounted on the upper surface of the printed circuit board 10 as an example, but there is no limitation thereto, and the electromagnetic wave shielding structure 1 according to an embodiment of the disclosure may have a structure of shielding a single element or various numbers of elements.

The description using terms "upper" and "lower" regarding the elements below is about relative concept defined referring to the drawings, and the meaning of the terms "upper" and "lower" may be switched in accordance with the arrangement of the electromagnetic wave shielding structure 1 including the printed circuit board 10 and the plurality of elements 111 and 112.

The plurality of elements 111 and 112 may be mounted by soldering performed on one surface of the printed circuit board 10.

For example, each of the plurality of elements 111 and 112 may include a connection terminal (not shown) connected to the printed circuit board 10.

The connection terminal may be formed, for example, as a ball grid array (BGA) type such as a solder ball. However, the connection terminal may not be limited to the BGA type and may be formed as various types of, for example, Quad Flat No Lead (QFN), Plastic Leaded Chip Carrier (PLCC), Quad Flat Package (QFP), Small Out Line Package (SOP), Thin/Shrink/Thin Shrink SOP (TSOP/SSOP/TSSOP), and the like depending on a lead shape of the elements 111 and 112.

In addition, the printed circuit board 10 may include a plurality of connection pads (not shown) connectable to the connection terminals of the plurality of elements 111 and 112.

The connection pads may be disposed on the upper surface of the printed circuit board 10 and may be electrically connected to the connection terminals of the plurality of elements 111 and 112, respectively.

In addition, a ground pad 11 may be disposed on one surface of the printed circuit board 10 on which the plurality of elements 111 and 112 are mounted.

The ground pad 11 may be formed to surround the plurality of elements 111 and 112 mounted on the printed circuit board 10.

In addition, the ground pad 11 may be formed to surround the insulation member 30 which will be described below and formed on one surface of the printed circuit board 10 on which the plurality of elements 111 and 112 are mounted.

The ground pad 11 may be formed along an outline of a preset shielding area on the printed circuit board 10 and this outline may have a shape of a closed loop in which the plurality of elements 111 and 112 mounted on the printed circuit board 10 are disposed.

For example, as illustrated in FIG. 1, the ground pad 11 may have a shape of a ring which is curved several times corresponding to the outline of the shielding area. Such a ground pad 11 may have a shape having a plurality of curved portions in accordance with shapes, sizes, and arrangement of other external elements or components of the electromagnetic wave shielding structure 1, in addition to shapes, sizes, and arrangement of the plurality of elements 111 and 112 to be surround with the insulation member 30.

The plurality of elements 111 and 112 to be shielded may be disposed in the ground pad 11.

The electromagnetic wave shielding structure 1 according to an embodiment of the disclosure may be configured to cover various shapes of shielding areas in accordance with an internal structure of an electronic device applied with the electromagnetic wave shielding structure 1, in addition to the arrangement of the plurality of elements 111 and 112, and the shape of the ground pad 11 may be variously changed in accordance with the shape of the shielding area.

An upper portion of the ground pad 11 disposed on the upper surface of the printed circuit board 10 may be exposed from the printed circuit board 10 and the ground pad 11 may be integrally formed with a ground layer (not shown) disposed in the printed circuit board 10.

Further, the ground pad 11 may be grounded with each ground terminal of the plurality of elements 111 and 112.

The insulation member 30 may be made of a pre-molded insulating material and attached to the printed circuit board 10 to cover the plurality of elements 111 and 112 mounted on the printed circuit board 10, thereby insulating the plurality of elements 111 and 112.

The insulation member 30 may be molded in advance by a method such as injection molding of the insulating material and may have a shape corresponding to a shape of the preset shielding area to cover the plurality of elements 111 and 112.

Accordingly, the insulation member 30 may be easily molded in various shapes corresponding to the shape of the shielding area and the shapes of the plurality of elements 111 and 112.

The insulation member 30 is preferably made of an insulating material such as silicone or epoxy maintaining a shape and physical properties thereof even at a high temperature of 145° C. or higher.

The insulation member 30 may have predetermined elasticity after the molding and accordingly, it is possible to maintain stable shielding performance and shielding structure, at the time of impact or bending applied with respect to the electronic device including the electromagnetic wave shielding structure 1.

As illustrated in FIGS. 2 and 3, the insulation member 30 may include a plurality of accommodation grooves S1 and S2 which are formed on one side facing the printed circuit board 10 and accommodate the plurality of elements 111 and 112.

The plurality of accommodation grooves S1 and S2 may be formed to be recessed on a lower portion of the insulation member 30, and the plurality of accommodation grooves S1 and S2 may accommodate the plurality of elements 111 and 112 therein, when the insulation member 30 is attached to the printed circuit board 10.

The plurality of accommodation grooves S1 and S2 are preferably formed in shapes corresponding to the shapes of the plurality of elements 111 and 112 mounted on the printed circuit board 10.

Shapes, arrangement, and number of the plurality of accommodation grooves S1 and S2 may be variously changed in accordance with the sizes, the arrangement, and the number of the plurality of elements.

In addition, FIG. 2 illustrates that the two elements 111 and 112 are accommodated in the two accommodation grooves S1 and S2, respectively, as an example, but the insulation member 30 may include one or three or more accommodation grooves and the plurality of elements may be accommodated in the plurality of accommodation grooves, respectively, or two or more elements may be accommodated in any one of the plurality of accommodation grooves.

More specifically, the insulation member 30 may include an upper surface portion 301 disposed on the upper side of the plurality of elements 111 and 112, and a side wall portion 302 disposed along the circumference of the upper surface portion 301 to surround the plurality of elements 111 and 112.

The upper surface portion 301 and the side wall portion 302 of the insulation member 30 form an appearance of the insulation member 30 and the plurality of elements 111 and 112 are disposed in an inner portion of the upper surface portion 301 and the side wall portion 302 of the insulation member 30.

The plurality of accommodation grooves S1 and S2 of the insulation member 30 are formed in an inner portion of the side wall portion 302.

In addition, as illustrated in FIG. 2, the insulation member 30 may include at least one protrusion 303 which is disposed on an inner portion of the side wall portion 302 and protrudes from the upper surface portion 301 towards the printed circuit board 10.

The protrusion 303 may partition the plurality of accommodation grooves S1 and S2. For example, the protrusion 303 may partition an inner space of the side wall portion 302 into a plurality of spaces, thereby partitioning the plurality of accommodation grooves S1 and S2.

FIG. 2 illustrates that one protrusion 303 is disposed on the inner portion of the side wall portion 302 to partition the two accommodation grooves S1 and S2 as an example, for convenience of description, but the insulation member 30 may include a plurality of accommodation grooves capable of accommodating a plurality of elements, and accordingly, the insulation member 30 may include a plurality of protrusions.

In addition, a shape of the protrusion of the insulation member 30 may be variously changed in accordance with the shapes of the plurality of accommodation grooves.

The upper surface portion 301, the side wall portion 302, and the protrusion 303 described above may be integrally formed through injection molding of an insulating material.

In addition, as illustrated in FIG. 3, the insulation member 30 may be formed in a shape corresponding to the shape of the preset shielding area on the printed circuit board 10 and may be formed in a shape corresponding to the shape of the ground pad 11.

Specifically, the shape of the upper surface portion 301 of the insulation member 30 may be a shape corresponding to the preset shielding area and a shape corresponding to the shape of the ground pad 11.

Accordingly, the shape of the side wall portion 302 may also correspond to the shape of the shielding area and may be a shape of a closed loop corresponding to the shape of the ground pad 11.

In addition, the side wall portion 302 is preferably disposed on an inner portion of the ground pad 11 so that the conductive coating layer 40 which will be described below is connected to the ground pad 11.

Accordingly, the ground pad 11 may have a shape surrounding the insulation member 30 and have a shape of a closed loop surrounding the side wall portion 302 of the insulation member 30. Accordingly, the side wall portion 302 may have a shape of a ring disposed on an inner portion of the ground pad 11 along the circumference of the ground pad 11, and a diameter of the ground pad 11 may be set to be greater than a diameter of the side wall portion 302.

In addition, the side wall portion 302 may be formed to be disposed on an inner portion of the ground pad 11 or to cover a part of the inner portion of the ground pad 11 along the ground pad 11.

Accordingly, the side wall portion 302 may also have a shape of a ring having curved portions curved several times corresponding to the outline of the shielding area, and the plurality of elements 111 and 112 to be shielded may be disposed on an inner portion of the side wall portion 302.

The insulation member 30 may be easily manufactured in a desired shape through injection molding or the like of an insulating material, and thus, the insulation member 30 may be easily manufactured in a shape capable of covering a shielding area between a plurality of elements disposed with high density.

A width of the side wall portion 302 of the insulation member 30 may be set to have a minimum width for insulating the plurality of elements 111 and 112, thereby reducing a width of the ground pad 11. Therefore, it is possible to reduce the entire size of the electromagnetic wave shielding structure 1 disposed in the electronic device.

In addition, the electromagnetic wave shielding structure 1 according to an embodiment of the disclosure may further include an adhesive portion 20 which is disposed between the insulation member 30 and the printed circuit board 10 and attaches the insulation member 30 to the printed circuit board 10.

The adhesive portion 20 may be formed of an adhesive material 201 (see FIG. 4B) having a predetermined viscosity applied onto the printed circuit board 10. The side wall portion 302 of the insulation member 30 may be attached to the adhesive material 201 applied to the printed circuit board 10 to form the adhesive portion 20.

The adhesive layer 20 may refer to a cured state after the insulation member 30 is adhered to the adhesive material 201 and it may be interpreted that the adhesive portion 20 and the adhesive material 201 have the same configuration.

As described above, the shape of the side wall portion 302 of the insulation member 30 corresponds to the shape of the ground pad 11 and the side wall portion 302 of the insulation member 30 is disposed on an inner portion of the ground pad 11. Accordingly, the adhesive portion 20 is formed on an inner portion of the ground pad 11 along the circumference of the ground pad 11 on one surface of the printed circuit board 10.

Specifically, the adhesive portion 20 may be formed of the adhesive material 201 having a predetermined viscosity applied to an inner portion of the ground pad 11 along the circumference of the ground pad 11, and the insulation member 30 may be attached to the printed circuit board 10 by combining a lower end of the side wall portion 302 of the insulation member 30 with the applied adhesive material 201.

The adhesive material 201 having a predetermined viscosity may spread on the printed circuit board 10 during a process in which the lower end of the side wall portion 302 presses the adhesive material 201 for attachment of the insulation member 30, and the adhesive portion 20 may surround a part of the lower edge of the side wall portion 302, as illustrated in FIG. 2.

The adhesive portion 20 may be formed of the insulating material same as that of the insulation member 30 and is preferably made of an adhesive material including silicone or epoxy maintaining a shape and physical properties thereof even at a high temperature of 145° C. or higher.

In addition, the adhesive material 201 forming the adhesive portion 20 may have various curing properties such as room temperature curing properties, thermosetting properties, UV curing properties, and the like. In addition, if the adhesive material 201 is formed of a thermoset material, the adhesive material 201 is preferably formed of a material curable at a heating temperature at which the soldering of the plurality of elements 111 and 122 is not melted.

In addition, the adhesive portion 20 may have predetermined elasticity after being cured.

Since the insulation member 30 is attached to the printed circuit board 10 using the adhesive portion 20, it is possible to easily remove the adhesive portion 20 from the printed circuit board 10 using a tool having a paddle shape without blowing hot air during rework, thereby easily separating the insulation member 30 from the printed circuit board 10 together with the adhesive portion 20. As described above, in the electromagnetic wave shielding structure 1 according to an embodiment of the disclosure, a step for blowing hot air is omitted when separating the insulation member 30 from the printed circuit board 10, and accordingly, it is possible to prevent a problem such as separation of the plurality of elements 111 and 112 mounted on the printed circuit board 10 from the printed circuit board 10 or deviation thereof from a predetermined position due to the soldering melted due to the hot air.

The process for attaching the insulation member 20 to the adhesive material 201 will be described below.

As illustrated in FIG. 3, at least a part of the upper surface portion 301 of the insulation member 30 may have a stepped portion.

As described above, the insulation member 30 may be manufactured by a method such as injection molding of an insulating material and thus is easily molded in various shapes.

Specifically, the upper surface portion 301 of the insulation member 30 may include a first portion 301a and a second portion 301b which is stepped lower from the first portion 301a.

By forming the stepped structure on a part of the upper portion 301 of the insulation member 30, it is possible to more efficiently use an inner space of an electronic device including the electromagnetic wave shielding structure 1 therein and to realize a compact size of the entire electronic device including the electromagnetic wave shielding structure 1.

In addition, the insulation member 30 may have a stepped structure formed on a part of the side wall portion 302 or a stepped structure on a part of the exterior surface of the insulation member 30, in addition to the upper surface portion 301.

The structure of the first portion 301a and the second portion 302b of the upper surface portion 301 illustrated in FIG. 3 is merely an example, and at least a part of the exterior surface of the insulation member 30 may have various shapes and numbers of stepped structures.

As described above, the insulation member 30 may be easily formed in a shape corresponding to the shielding area having a shape curved several times, and a step or a curvature is formed at least on a part of the upper surface portion 301 or the side wall portion 302 of the insulation member 30. Accordingly, it is possible to minimize the space used by the electromagnetic wave shielding structure 1 in the electronic device. Therefore, it is possible to efficiently use the inner space of the electronic device in which the electromagnetic wave shielding structure 1 is disposed.

Returning to FIG. 2, the plurality of accommodation grooves S1 and S2 have heights formed to be higher than heights of the plurality of elements 111 and 122, respectively, to include a plurality of air gaps G1 and G2 formed between the upper surface portion 301 of the insulation member 30 and the plurality of elements 111 and 112.

The plurality of air gaps G1 and G2 may be formed in consideration of the manufacturing tolerance of the insulation member 30 so that the plurality of elements 111 and 112 may be easily accommodated in the plurality of accommodation grooves S1 and S2.

In addition, heights of the plurality of air gaps G1 and G2 may be formed to be different from each other and the heights of the plurality of air gaps G1 and G2 may be formed to be different from each other in accordance with the type of the elements accommodated in the plurality of accommodation grooves S1 and S2.

For example, if an element to be accommodated in any one of the plurality of accommodation grooves S1 and S2 is an antenna, the heights of the air gaps G1 and G2 may be set as heights so that radio waves emitted from the antenna may be easily emitted outside.

The shapes and the heights of the plurality of air gaps G1 and G2 may be variously changed in accordance with the type, size, and shape of the elements to be accommodated in the plurality of accommodation grooves S1 and S2.

In addition, a thermal interface material (TIM, not shown) may be disposed on the plurality of air gaps G1 and G2 to easily radiate heat emitted from the plurality of elements 111 and 112 outside.

In addition, at least a part of the protrusion 303 may be spaced apart from the printed circuit board 10 so that the plurality of accommodation grooves S1 and S2 communicate with each other.

For example, as illustrated in FIG. 2, the lower end of the protrusion 303 may be spaced apart from the printed circuit board 10 in a state where the side wall portion 302 of the insulation member 30 is attached to the printed circuit board 10, and accordingly, the plurality of accommodation grooves S1 and S2 may communicate with each other.

Therefore, even if the internal air in any one of the plurality of air gaps G1 and G2 expands due to overheating of the corresponding one of the plurality of elements 111 and 112 accommodated in the plurality of accommodation grooves S1 and S2, the expanded air may move to the connected adjacent accommodation groove, thereby preventing separation of the insulation member 30 from the adhesive portion 20 or separation thereof from the printed circuit board 10.

In addition, as illustrated in FIG. 3, the side wall portion 302 of the insulation member 30 may include a vent hole 30H which penetrates the side wall portion 302 to communicate with at least one of the plurality of accommodation grooves S1 and S2.

Even if the internal air of the accommodation grooves S1 and S2 expands due to overheating of the plurality of elements 111 and 112, the expanded air may be discharged from the inside of the accommodation grooves S1 and S2 outside of the insulation member 30 through the communicated adjacent accommodation grooves and the vent hole 30H.

The vent hole 30H is preferably formed on the lower end of the side wall portion 302 not to deteriorate the shielding performance for the plurality of elements 111 and 112 through the insulation member 30 and the conductive coating layer 40 covering the insulation member 30.

In addition, the vent hole 30H may be formed in a small size so that the internal air of the plurality of accommodation grooves S1 and S2 may be discharged outside of the insulation member 30. Further, since the conductive coating layer 40 covering the exterior surface of the insulation member 30 which will be described below is formed by spraying a conductive material to the exterior surface of the insulation member 30, the vent hole 30H may not be blocked due to the conductive coating layer 40 (vent hole 30H which is a hole having a small size is not illustrated in FIG. 1).

As illustrated in FIGS. 1 and 2, the electromagnetic wave shielding structure 1 may include the conductive coating layer 40 covering the exterior surface of the insulation member 30 and the conductive coating layer 40 may be grounded by being connected to the ground pad 11.

Specifically, the end of the conductive coating layer 40 may be connected to the ground pad 11 to shield the insulation member 30 and the plurality of elements 111 and 112 disposed in the insulation member 30.

The conductive coating layer 40 may cover the entire exterior surface of the insulation member 30 since a shielding material formed of a conductive material is sprayed by a separate nozzle N (see FIG. 4E) in a form of a spray, or the conductive coating layer 40 may cover the entire exterior surface of the insulation member 30 using a separate ink jet device.

By doing so, the conductive coating layer 40 may be formed as a thin film and the shape of the conductive coating layer 40 may correspond to the appearance of the insulation member 30, as illustrated in FIG. 1.

In addition, the conductive coating layer 40 may also be electrically connected to the ground pad 11, since the shielding material is applied to a boundary between the insulation member 30 and the printed circuit board 10 during a process in which the shielding material is coated over the exterior surface of the insulation member 30.

For this, the ground pad 11 preferably has a shape surrounding the side wall portion 302 of the insulation member 30, and accordingly, the conductive coating layer 40 may cover at least a part of the ground pad 11.

A thickness of the conductive coating layer 40 may be set as 10 μm and a conductivity of the conductive coating layer 40 may be set as $10^5$ S/m or more.

The conductive coating layer 40 may be formed of an electroconductive material. Such an electroconductive material may include at least one of an electroconductive filler or a binder resin.

As the electroconductive filler, metal such as Ag, Cu, Ni, Al, or Sn may be used, conductive carbon such as carbon black, carbon nanotube (CNT), or graphite may be used, a metal coated material such as Ag/Cu, Ag/Glass fiber, or Ni/Graphite may be used, or a conductive polymer material such as polypyrrole or polyaniline may be used. In addition, the electroconductive filler may be any one of a flake type, a sphere type, a rod type, and a dendrite type or a combination thereof.

As the binder resin, a silicone resin, an epoxy resin, a urethane resin, or an alkyd resin may be used. The material forming the conductive coating layer 40 may additionally include additives (thickener, antioxidant, polymer surfactant, or the like) and solvents (water, alcohol, or the like) for enhancing other performances.

As described above, the electromagnetic wave shielding structure 1 according to an embodiment of the disclosure may easily shield the plurality of elements 111 and 112 disposed in the insulation member 30 through a simple step of attaching the insulation member 30 pre-molded in a desired shape to the printed circuit board 10 through the adhesive portion 20 and forming the conductive coating layer 40 covering the exterior surface of the insulation member 30 and the ground pad 11.

In addition, the insulation member 30 may easily cover a shielding area having a complicated shape in an electronic device such as a smartphone, in which high integrated design of elements is required, since it is easily molded in a desired shape.

FIGS. 4A to 4E are cross-sectional views illustrating an embodiment of a process for manufacturing the electromagnetic wave shielding structure 1 illustrated in FIG. 2.

Hereinafter, the process for manufacturing the electromagnetic wave shielding structure 1 according to an embodiment of the disclosure will be described sequentially with reference to FIGS. 4A to 4E.

Figure 4A:
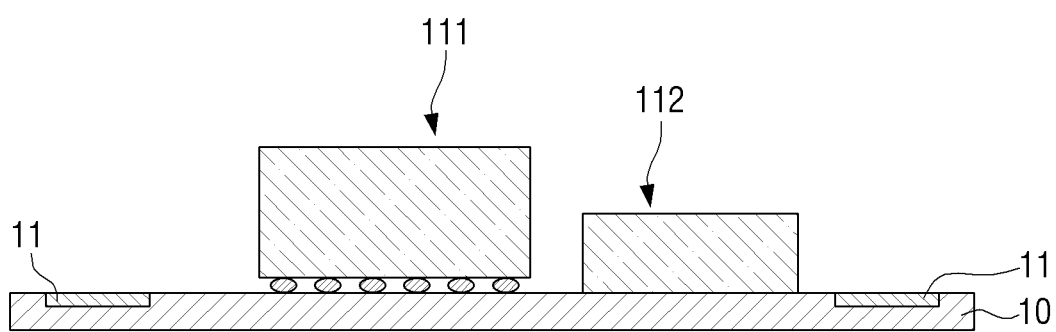
FIG. 4A to 4E are cross-sectional views illustrating an embodiment of a process for manufacturing the electromagnetic wave shielding structure illustrated in FIG. 2.

As illustrated in FIG. 4A, the printed circuit board 10, on which the plurality of elements 111 and 112 are mounted, is disposed.

As described above, at least one of elements 111 and 112 to be shielded may be disposed on one surface of the printed circuit board 10 and the plurality of elements 111 and 112 mounted on the printed circuit board 10 may be shielded.

Figure 4B:
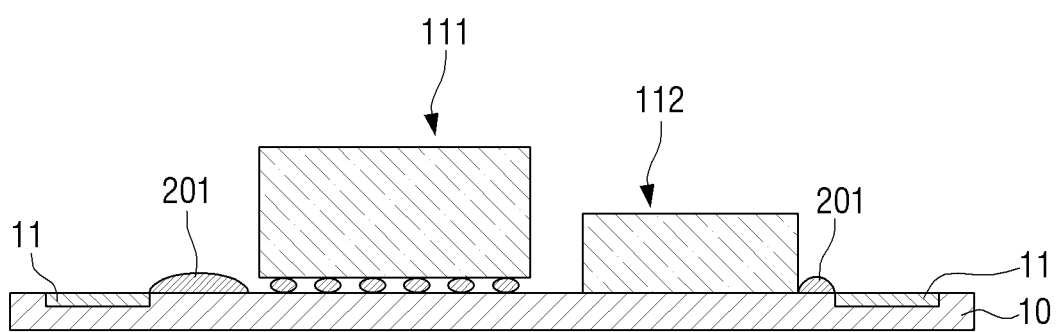

Then, as illustrated in FIG. 4B, the adhesive material 201 is discharged onto the printed circuit board 10, on which at least one of the elements 111 and 112 is mounted.

Specifically, the adhesive material 201 having a predetermined viscosity may be discharged to one surface of the printed circuit board 10 along the circumference of the ground pad 11 through a separate movable nozzle (not shown) and the adhesive material 201 is preferably discharged to the inner portion of the ground pad 11.

Figure 4C:
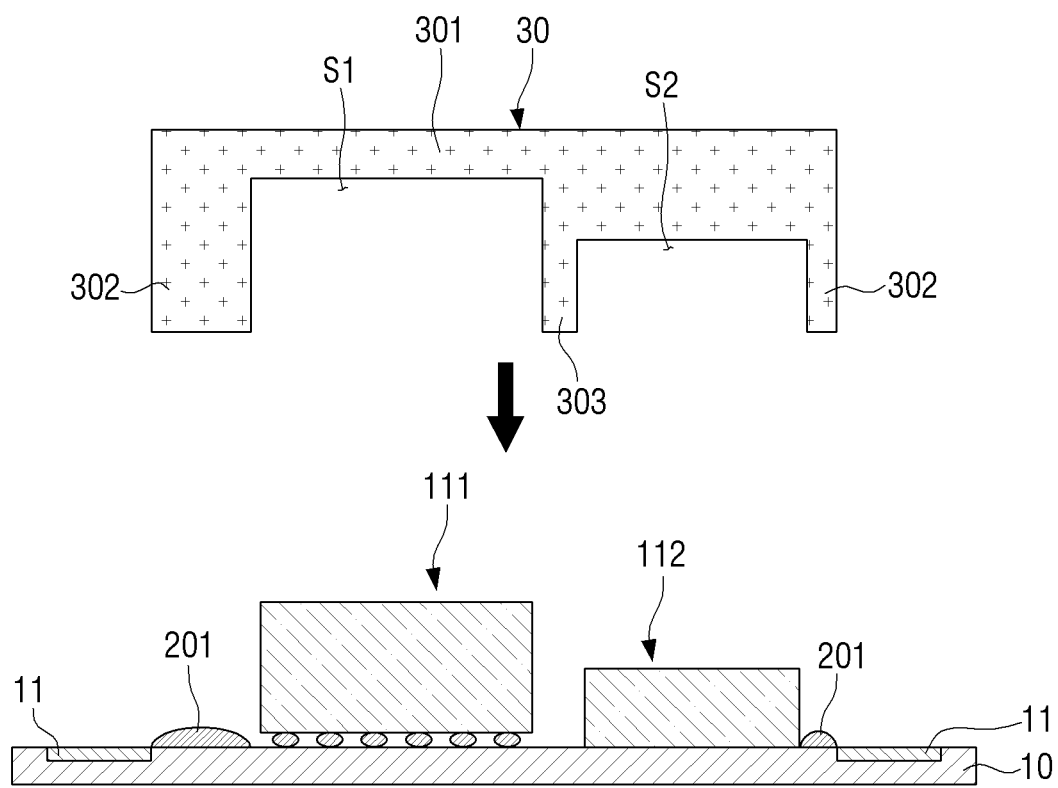
Figure 4D:
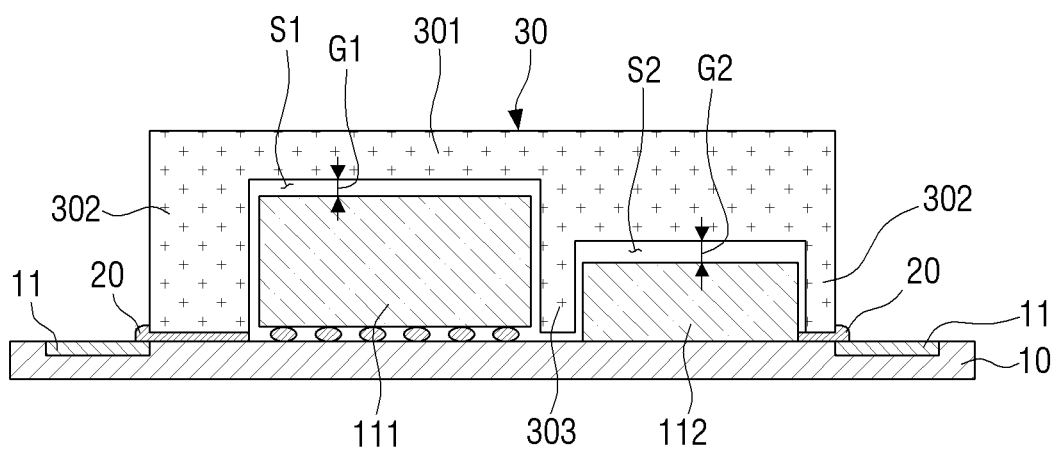

Then, as illustrated in FIGS. 4C and 4D, the insulation member 30 pre-molded to surround the plurality of elements 111 and 112 may be attached to the adhesive material 201 to combine the insulation member 30 to the printed circuit board 10.

Specifically, in the process for attaching the insulation member 30 to the adhesive material 201, the lower end of the side wall portion 302 of the insulation member 30 may press the adhesive material 201 having a predetermined viscosity, and accordingly, the adhesive material 201 may form the adhesive portion 20 surrounding a part of the lower end of the side wall portion 302 of the insulation member 30.

The adhesive portion 20 and the adhesive material 201 are terms for distinguishing the states before and after being pressed by the side wall portion 302 of the insulation member 30 and the adhesive portion 20 and the adhesive material 201 may be understood to have the same configuration.

As illustrated in FIG. 4D, the adhesive portion 20 may be formed to cover a part of the ground pad 11 since the adhesive material 201 spreads in a horizontal direction in the process in which the adhesive material 201 presses the lower end of the side wall portion 302 of the insulation member 30.

Figure 4E:
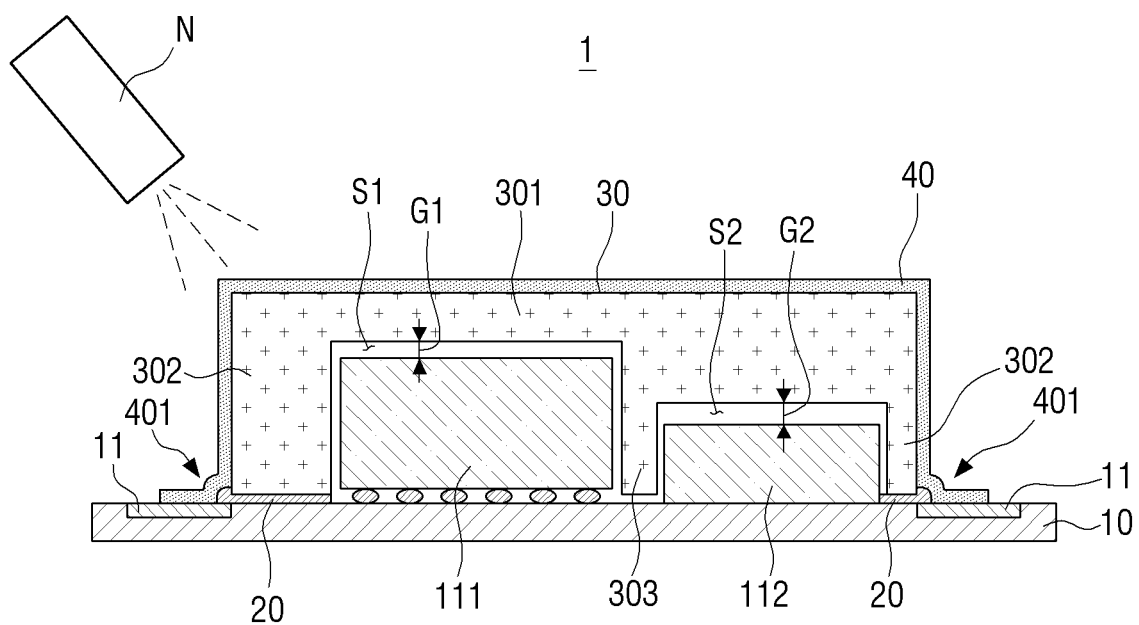

Hereinafter, as illustrated in FIG. 4E, the conductive coating layer 40 is formed by applying the conductive material to cover the exterior surface of the insulation member 30 and at least a part of the ground pad 11.

The conductive coating layer 40 may be formed by spraying or jetting the shielding material formed of the conductive material in a form of a spray through the nozzle N.

In the process for forming the conductive coating layer 40, the conductive material coated on the exterior surface of the insulation member 30 may be connected to the ground pad 11, thereby grounding the conductive coating layer 40 covering the insulation member 30.

By doing so, the conductive coating layer 40 may shield the insulation member 30 and the plurality of elements 111 and 112 disposed in the insulation member 30 from external electromagnetic waves and may prevent the electromagnetic waves emitted from the plurality of elements 111 and 112 disposed in the insulation member 30 from interfering in other components disposed outside of the insulation member 30.

FIGS. 5A to 5E are cross-sectional views illustrating another embodiment of a process for manufacturing the electromagnetic wave shielding structure 1 illustrated in FIG. 2.

The process for manufacturing the electromagnetic wave shielding structure 1 illustrated in FIGS. 5A to 5E are substantially the same as the process for manufacturing the electromagnetic wave shielding structure 1 illustrated in FIGS. 4A to 4E, and therefore the overlapped description will not be repeated, and another embodiment of the process for manufacturing the electromagnetic wave shielding structure 1 will be described by focusing on a method for forming the conductive coating layer 40.

Figure 5A:
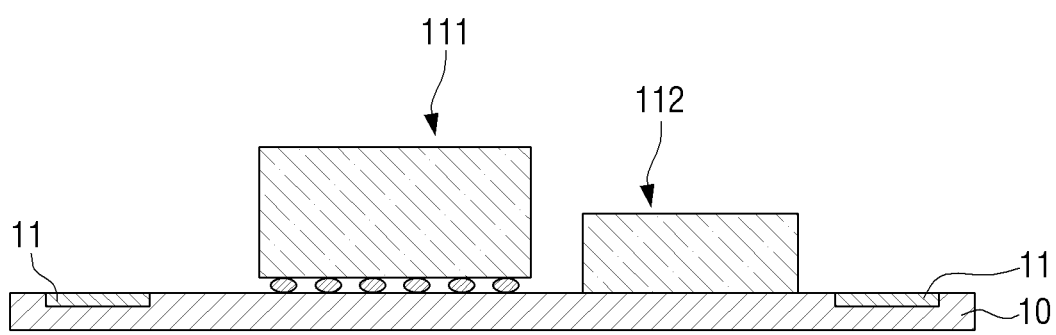
FIGS. 5A to 5E are cross-sectional views illustrating another embodiment of a process for manufacturing the electromagnetic wave shielding structure illustrated in FIG. 2.

As illustrated in FIG. 5A, the printed circuit board 10, on which the plurality of elements 111 and 112 are mounted, is disposed.

Figure 5B:
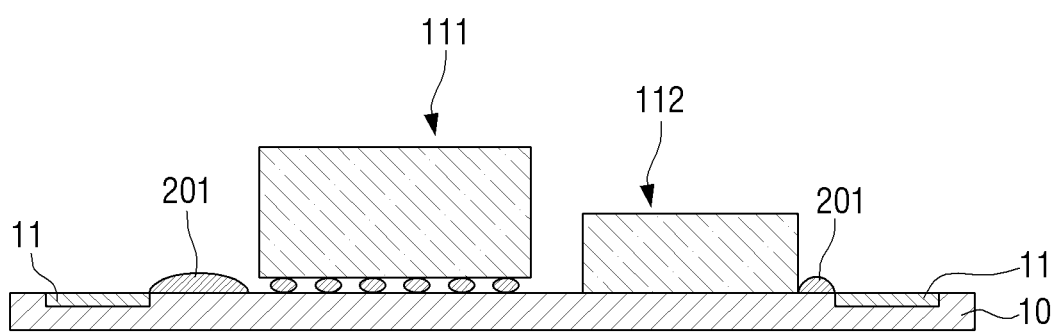

Then, as illustrated in FIG. 5B, the adhesive material 201 is discharged onto the printed circuit board 10, on which at least one of the elements 111 and 112 is mounted.

Specifically, the adhesive material 201 having a predetermined viscosity may be discharged to one surface of the printed circuit board 10 along the circumference of the ground pad 11 and the adhesive material 201 is preferably discharged to the inner portion of the ground pad 11.

Figure 5C:
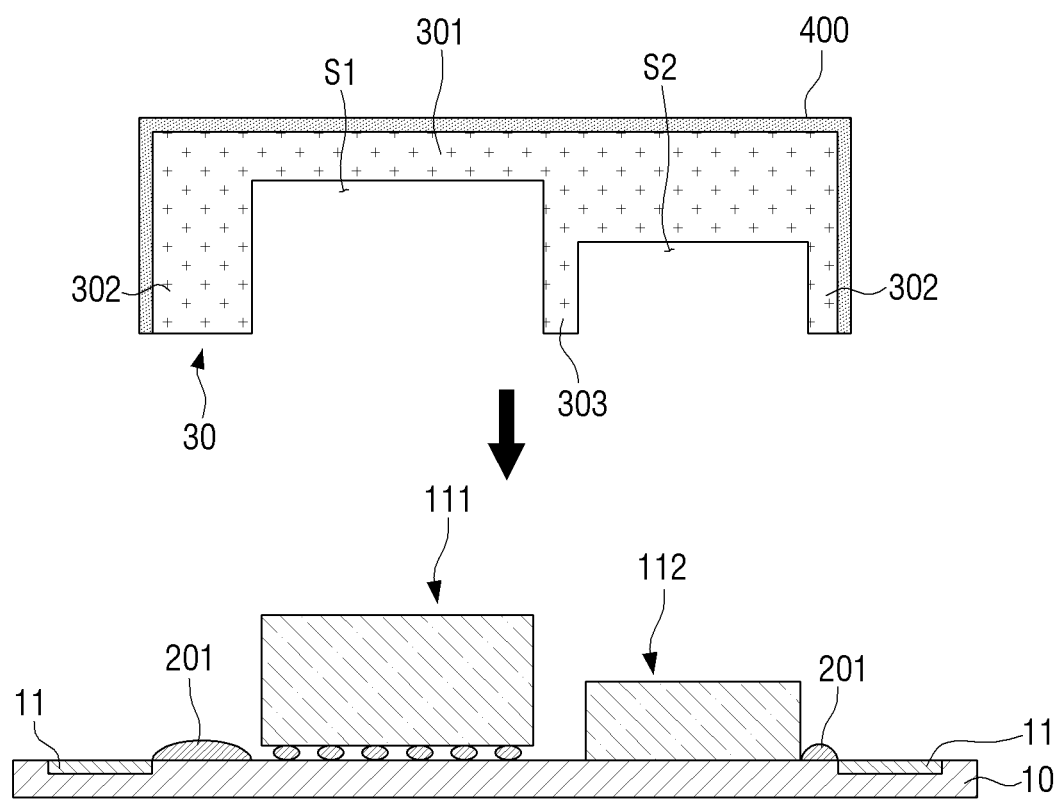
Figure 5D:
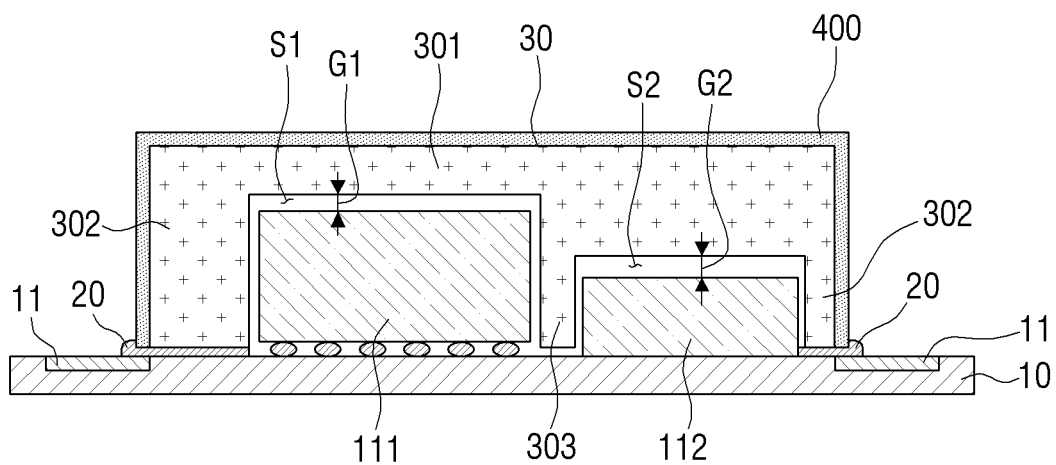

Then, as illustrated in FIGS. 5C and 5D, the insulation member 30 formed of an insulating material pre-molded to surround the plurality of elements 111 and 112 and combined with a conductive coating portion 400 on an exterior surface thereof is attached to the adhesive material 201, and accordingly, the insulation member 30 is combined with the printed circuit board 10.

The insulation member 30 illustrated in FIGS. 5C and 5D is formed of the pre-molded insulating material to include the plurality of accommodation grooves S1 and S2 accommodating the plurality of elements 111 and 112 and is attached to the printed circuit board 10 in a state of being combined with the conductive coating portion 400 covering the exterior surface of the insulation member 30, unlike the insulation member 30 illustrated in FIGS. 4C and 4D.

The conductive coating portion 400 combined with the insulation member 30 covers an upper surface and a side surface of the insulation member 30 and covers the exterior surface of the upper surface portion 301 and the side wall portion 302 of the insulation member 30.

The conductive coating portion 400 covering the exterior surface of the insulation member 30 may be formed by spraying or jetting the shielding material formed of the conductive material to the exterior surface of the insulation member 30 after molding the insulation member 30. In addition, the conductive coating portion 400 may be formed of a conductive sheet attached to the exterior surface of the insulation member 30.

Further, as illustrated in FIG. 5D, the adhesive portion 20 may surround a part of a lower edge of the side wall portion 302 of the insulation member 30 and surround a part of an end of the conductive coating portion 400, since the adhesive material 201 spreads in the process of being pressed by the lower end of the side wall portion 302 of the insulation member 30.

In addition, the adhesive portion 20 may be formed to cover a part of the ground pad 11.

Figure 5E:
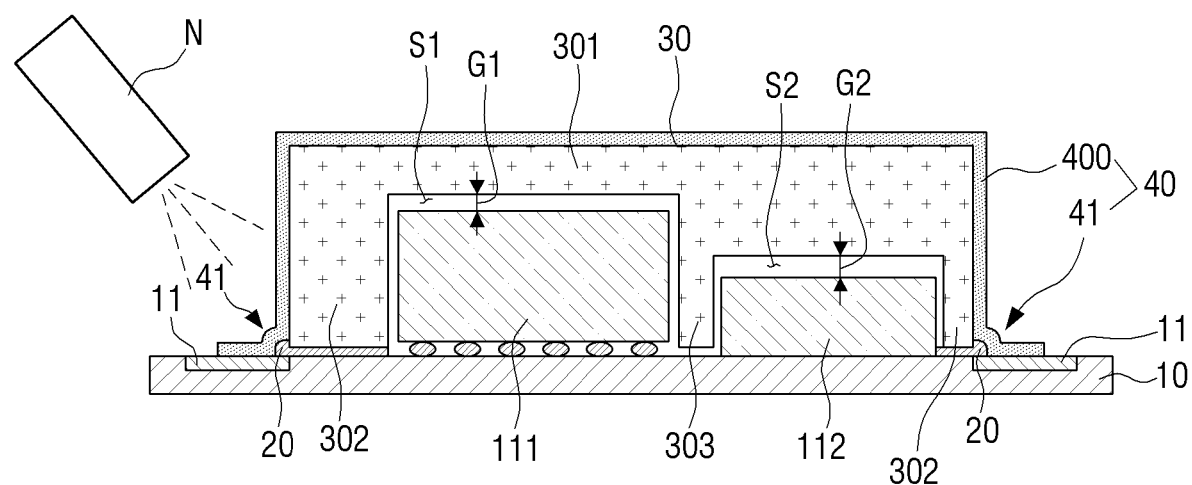

Then, as illustrated in FIG. 5E, the conductive coting portion 400 is electrically connected to the ground pad 11 by applying the conductive material to a boundary between the insulation member 30 and the printed circuit board 10.

By doing so, it is possible to form the conductive coating layer 40 capable of shielding the insulation member 30 and the plurality of elements 111 and 112 in the insulation member 30 by covering the exterior surface of the insulation member 30 and being connected to the ground pad 11.

Specifically, a connection portion 41 for electrically connecting the conductive coating portion 400 to the ground pad 11 is formed by spraying or jetting the conductive material to a boundary between the insulation member 30 and the printed circuit board 10 using the nozzle N.

The connection portion 41 may be formed of the same conductive material as in the conductive coating portion 400.

The connection portion 41 may cover at least a part of the ground pad 11 and accordingly, the conductive coating portion 400 connected to the connection portion 41 may be grounded.

The connection portion 41 may be integrally formed with the conductive coating portion 400 in the forming process, and the conductive coting portion 400 combined on the exterior surface of the insulation member 30 in advance and the connection portion 41 may be collectively referred to as the conductive coating layer 40.

As described above, since the conductive coating portion 400 is combined on the exterior surface of the insulation member 30 in advance, the conductive coating layer 40 may be formed through only a simple step of spraying or jetting the conductive material to only a boundary between the insulation member 30 and the printed circuit board 10 using the nozzle N.

The conductive coating layer 40 including the conductive coating portion 400 and the connection portion 41 may shield the insulation member 30 and the plurality of elements 111 and 112 disposed in the insulation member 30 from external electromagnetic waves and may prevent the electromagnetic waves emitted from the plurality of elements 111 and 112 disposed in the insulation member 30 from interfering in other components disposed outside of the insulation member 30.

Figure 6A:
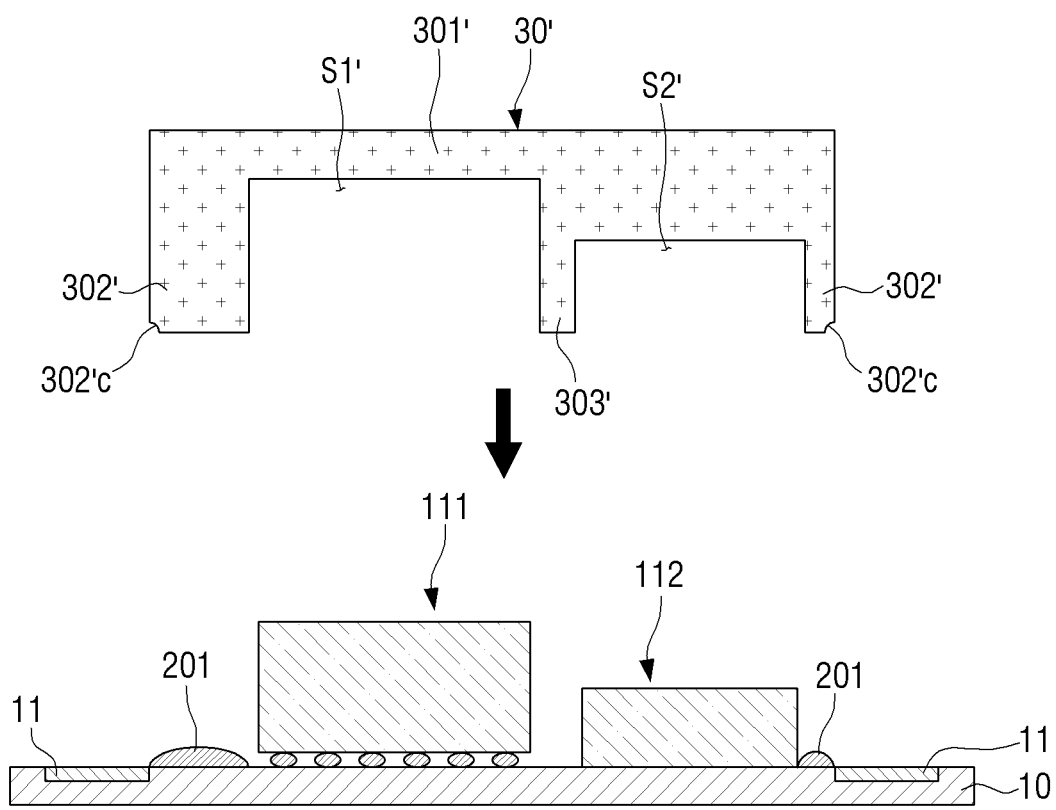
FIG. 6A is a cross-sectional view schematically illustrating an operation in which an insulation member is attached to a printed circuit board according to a modification example.
Figure 6B:
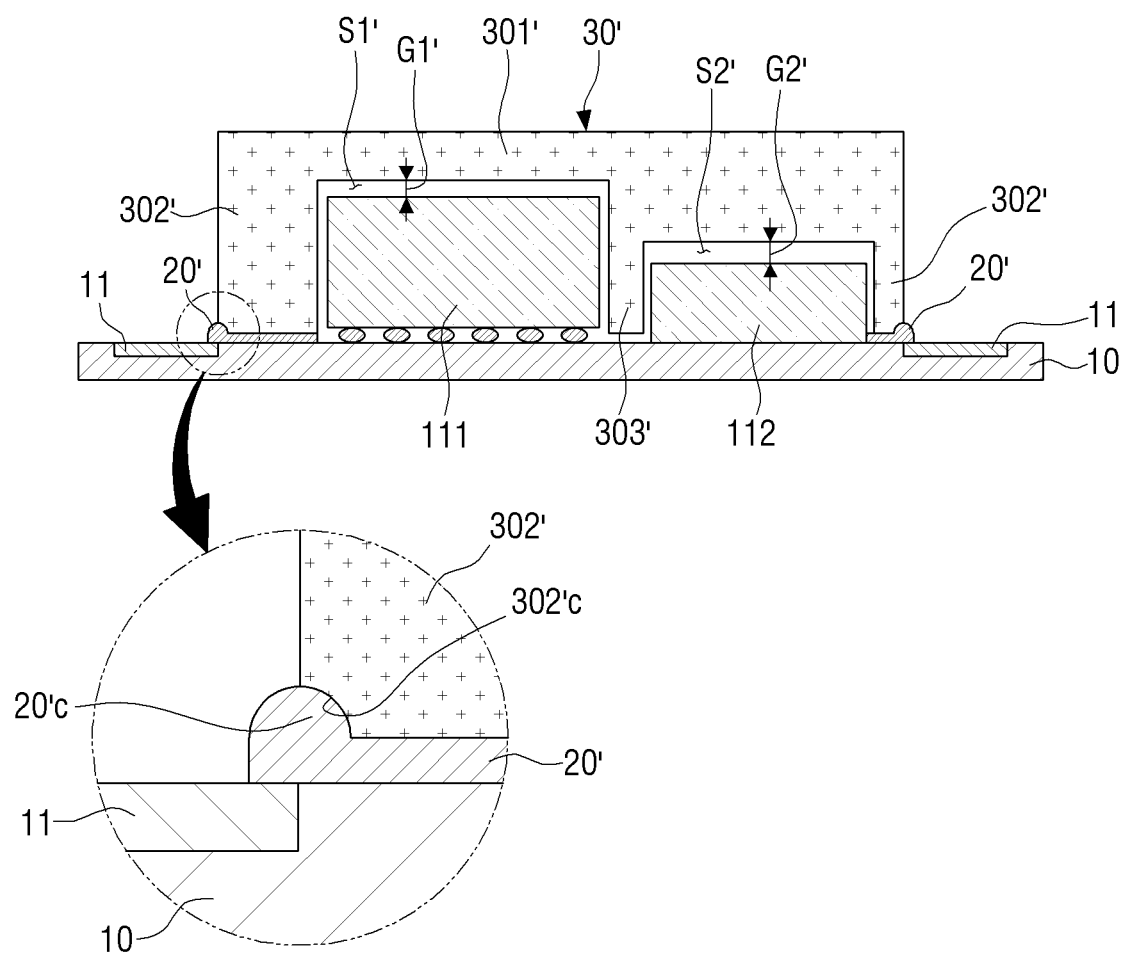
FIG. 6B is a cross-sectional view illustrating a state where the insulation member illustrated in FIG. 6A is attached to the printed circuit board.
Figure 6C:
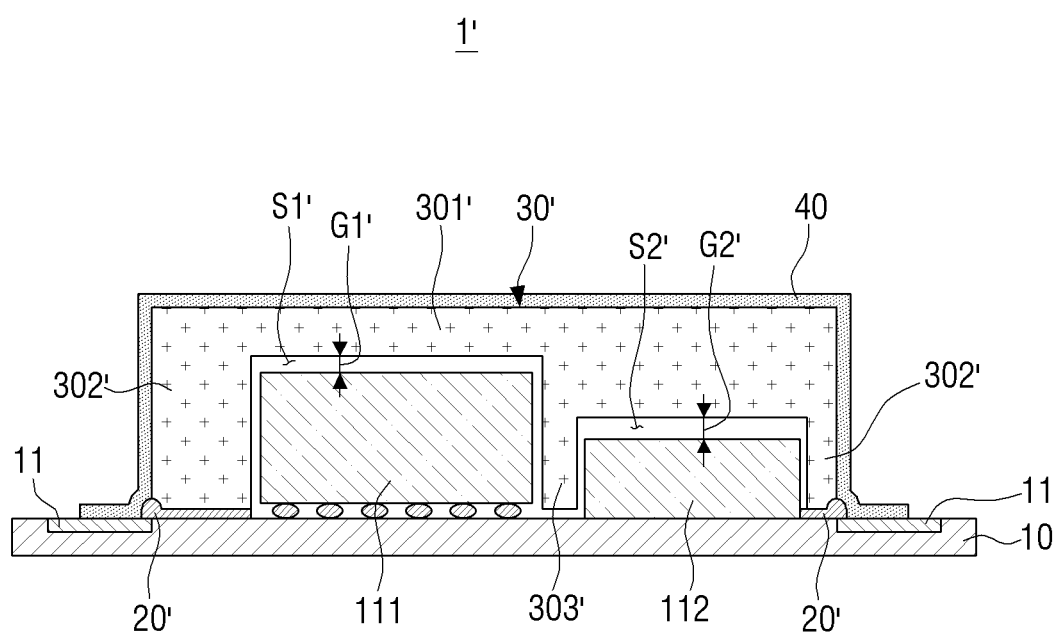
FIG. 6C is a cross-sectional view illustrating an electromagnetic wave shielding structure including the insulation member illustrated in FIG. 6B.

FIG. 6A is a cross-sectional view schematically illustrating an operation in which an insulation member 30' is attached to the printed circuit board 10 according to a modification example, FIG. 6B is a cross-sectional view illustrating a state where the insulation member 30' illustrated in FIG. 6A is attached to the printed circuit board, and FIG. 6C is a cross-sectional view illustrating an electromagnetic wave shielding structure 1' including the insulation member 30' illustrated in FIG. 6B.

The manufacturing process of the electromagnetic wave shielding structure 1' illustrated in FIGS. 6A to 6C is substantially the same as the manufacturing process of the electromagnetic wave shielding structure 1 illustrated in FIGS. 4A to 4E with only some different structures of the insulation member 30', and therefore, hereinafter, the description will be made by focusing on the structures insulation member 30' according to a modification example.

As illustrated in FIGS. 6A and 6B, the insulation member 30' according to a modification example may be made of a pre-molded insulating material and attached to the printed circuit board 10 to cover the plurality of elements 111 and 112 mounted on the printed circuit board 10, thereby insulating the plurality of elements 111 and 112.

The insulation member 30' may be molded in advance by a method such as injection molding of the insulating material and may be formed to have a shape corresponding to a shape of the preset shielding area to cover the plurality of elements 111 and 112.

The insulation member 30' may include a plurality of accommodation grooves S1' and S2' which are formed on one side facing the printed circuit board 10 and accommodate the plurality of elements 111 and 112.

Specifically, the insulation member 30' may include an upper surface portion 301' to be disposed on the upper side of the plurality of elements 111 and 112, and a side wall portion 302' to be disposed along the circumference of the upper surface portion 301' to surround the plurality of elements 111 and 112, and the plurality of accommodation grooves S1' and S2' of the insulation member 30' may be formed in an inner portion of the side wall portion 302'.

In addition, the plurality of accommodation grooves S1' and S2' include a plurality of air gaps G1' and G2' formed between the upper surface portion 301' and the plurality of elements.

Further, the insulation member 30' may include at least one protrusion 303' which is disposed on an inner portion of the side wall portion 302' and protrudes from the upper surface portion 301' towards the printed circuit board 10, and the protrusion 303' may partition the plurality of accommodation grooves S1' and S2'.

The structure of the insulation member 30' including the upper surface portion 301', the side wall portion 302', and the protrusion 303' partitioning the plurality of accommodation grooves S1' and S2' is substantially similar to the structure of the insulation member 30 illustrated in FIGS. 2 and 3, and therefore, the overlapped description will not be repeated.

As illustrated in FIG. 6A, the side wall portion 302' of the insulation member 30' includes a recess 302'c formed on a lower edge of the side wall portion 302'.

The recess 302'c is a recessed structure of a part of a lower edge of the side wall portion 302' and may be formed along the lower edge of the side wall portion 302'.

The insulation member 30' may be easily manufactured in a desired shape through injection molding or the like of the insulating material, and accordingly, the recess 302'c may also be easily formed in the molding process of the insulation member 30'.

As illustrated in FIGS. 6A and 6B, the adhesive material 201 spreads in a horizontal direction, since the side wall portion 302' of the insulation member 30' presses the adhesive material 201 in the process of being attached to the adhesive material 201 having a predetermined viscosity.

The adhesive material 201 pressed by the lower end of the side wall portion 302' does not additionally spread, because a part thereof is accommodated in the recess 302'c during the spread in the horizontal direction.

That is, as illustrated in FIG. 6B, a part 20'c of an adhesive portion 20' is accommodated in the recess 302'c and is formed in a shape corresponding to a shape of the recess 302'c.

By doing so, it is possible to prevent the adhesive material 201 from entirely covering the ground pad 11, even if the adhesive material 201 spreads in a horizontal direction due to the pressing by the side wall portion 302'.

Accordingly, as illustrated in FIG. 6C, the conductive coating layer 40 and the ground pad 11 may be connected to each other in the process of forming the conductive coating layer 40 covering the exterior surface of the insulation member 30' after attaching the insulation member 30' to the printed circuit board 10.

As described above, the electromagnetic wave shielding structures 1 and 1' according to the embodiments of the disclosure described above may shield the plurality of elements 111 and 112 disposed in the insulation members 30 and 30' by molding the insulation members 30 and 30' in advance in a desired shape through injection molding of the insulating material and forming the conductive coating layer 40 after attaching the pre-molded insulation members 30 and 30' to the printed circuit board 10.

As described above, it is possible to easily shield elements disposed with high density only with a simple step by easily manufacturing the insulation members 30 and 30' corresponding to the shielding areas having various and complicated shapes, and it is also possible to realize a structure of an electronic device including an electromagnetic wave shielding structure in a compact manner by forming a compact structure of the entire electromagnetic wave shielding structure 1.

In addition, since the insulation members 30 and 30' may be formed of a material having elasticity, it is possible to ensure structural stability against external impact or bending and to easily remove the insulation members 30 and 30' attached to the adhesive portion 20 with a force at the time of rework.

Hereinabove, the embodiments of the disclosure have been described individually, but each embodiment may not be implemented solely, and the configurations and the operations of each embodiment may be implemented in combination of at least another embodiment.

While embodiments of the disclosure have been particularly shown and described with reference to the drawings, the embodiments are provided for the purposes of illustration and it will be understood by one of ordinary skill in the art that various modifications and equivalent other embodiments may be made from the disclosure. Accordingly, the true technical scope of the disclosure is defined by the technical spirit of the appended claims.

What is claimed is:

1. An electromagnetic wave shielding structure comprising:
   a printed circuit board on which a plurality of elements is mounted and that includes a ground pad surrounding the plurality of elements;
   an insulation member made of a pre-molded insulating material and attached to the printed circuit board to surround the plurality of elements, wherein the insulation member comprises a plurality of accommodation grooves dimensioned to provide a plurality of air gaps between the insulation member and the plurality of elements and at least one protrusion partitioning the plurality of accommodation grooves; and
   a conductive coating layer configured to cover an exterior surface of the insulation member,
   wherein the conductive coating layer is connected to the ground pad, and
   wherein a lower end of the at least one protrusion is spaced apart from the printed circuit board so that the plurality of accommodation grooves communicate with each other.

2. The electromagnetic wave shielding structure according to claim 1, further comprising:

an adhesive portion configured to be disposed between the insulation member and the printed circuit board and attach the insulation member to the printed circuit board.

3. The electromagnetic wave shielding structure according to claim 2, wherein the ground pad is formed on one surface of the printed circuit board in a shape surrounding the insulation member, and wherein the conductive coating layer covers at least a part of the ground pad.

4. The electromagnetic wave shielding structure according to claim 3, wherein the adhesive portion is formed on an inner portion of the ground pad along a circumference of the ground pad on one surface of the printed circuit board.

5. The electromagnetic wave shielding structure according to claim 4, wherein the plurality of accommodation grooves are formed on one side facing the printed circuit board and accommodating the plurality of elements.

6. The electromagnetic wave shielding structure according to claim 5, wherein the plurality of accommodation grooves is formed in a shape corresponding to shapes of the plurality of elements.

7. The electromagnetic wave shielding structure according to claim 6, wherein the insulation member comprises:

an upper surface portion disposed on an upper side of the plurality of elements; and a side wall portion disposed along a circumference of the upper surface portion and surrounding the plurality of elements;

wherein the plurality of accommodation grooves is formed on an inner portion of the side wall portion, and wherein the adhesive portion is disposed between the side wall portion and the printed circuit board.

8. The electromagnetic wave shielding structure according to claim 7, wherein the at least one protrusion is disposed on an inner portion of the side wall portion and protrudes from the upper surface portion towards the printed circuit board to partition the plurality of accommodation grooves.

9. The electromagnetic wave shielding structure according to claim 7, wherein the side wall portion comprises a vent hole penetrating the side wall portion to communicate with at least one of the plurality of accommodation grooves.

10. The electromagnetic wave shielding structure according to claim 9, wherein the vent hole is formed on a lower end of the side wall portion.

11. The electromagnetic wave shielding structure according to claim 7, wherein at least a part of the upper surface portion forms a step.

12. The electromagnetic wave shielding structure according to claim 7, wherein each of the plurality of accommodation grooves is dimensioned to have heights set to be higher than heights of the plurality of elements, respectively, and the plurality of air gaps is formed between the upper surface portion and the plurality of elements.

13. The electromagnetic wave shielding structure according to claim 7, wherein the side wall portion comprises a recess formed on a lower edge of the side wall portion, and wherein a part of the adhesive portion is accommodated in the recess.

14. A method for manufacturing an electromagnetic wave shielding structure, the method comprising:

discharging an adhesive material to an inner portion of a ground pad on a printed circuit board along a circumference of the ground pad surrounding a plurality of elements mounted on the printed circuit board;

attaching an insulation member made of a pre-molded insulating material to the adhesive material to surround the plurality of elements, wherein the insulation member comprises a plurality of accommodation grooves dimensioned to provide a plurality of air gaps between the insulation member and the plurality of elements and at least one protrusion partitioning the plurality of accommodation grooves; and coating a conductive material to cover an exterior surface of the insulation member and at least a part of the ground pad, and wherein a lower end of at least one protrusion is spaced apart from the printed circuit board so that the plurality of accommodation grooves communicate with each other.

* * * * *